United States Patent [19]

Gansauge et al.

[11] Patent Number: 5,010,389
[45] Date of Patent: Apr. 23, 1991

[54] INTEGRATED CIRCUIT SUBSTRATE WITH CONTACTS THEREON FOR A PACKAGING STRUCTURE

[75] Inventors: Peter Gansauge, Boeblingen; Volker Kreuter, Schoenaich; Helmut Schettler, Dettenhausen, all of Fed. Rep. of Germany

[73] Assignee: International Business Machines Corporation, Armonk, N.Y.

[21] Appl. No.: 529,827

[22] Filed: May 29, 1990

[30] Foreign Application Priority Data

Jul. 26, 1989 [EP] European Pat. Off. ........ 89113765.5

[51] Int. Cl.⁵ .............................................. H01L 23/48
[52] U.S. Cl. ......................................... 357/67; 357/71; 357/74; 357/80
[58] Field of Search ................. 357/72, 80, 67, 65, 357/71, 74

[56] References Cited

U.S. PATENT DOCUMENTS

| | | | |
|---|---|---|---|
| 3,311,966 | 4/1967 | Shaheen et al. | 357/65 |
| 3,495,133 | 2/1970 | Miller | 354/65 |
| 3,604,989 | 9/1971 | Haneta et al. | 357/65 |
| 3,686,698 | 8/1972 | Akeyama et al. | 357/67 |
| 4,029,562 | 6/1977 | Feng et al. | 357/65 |
| 4,319,264 | 3/1982 | Gangulee et al. | 357/67 |
| 4,386,116 | 5/1983 | Nair et al. | 427/99 |
| 4,480,288 | 10/1984 | Gazdik et al. | 361/398 |
| 4,552,615 | 11/1985 | Amendola et al. | 158/659.1 |
| 4,675,717 | 6/1987 | Herrero et al. | 357/71 |
| 4,739,389 | 4/1988 | Goedbloed | 357/75 |
| 4,866,507 | 9/1989 | Jacobs et al. | 357/74 |

FOREIGN PATENT DOCUMENTS

| | | |
|---|---|---|
| 0083020 | 12/1982 | European Pat. Off. . |
| 0114211 | 11/1983 | European Pat. Off. . |
| 0163172 | 5/1985 | European Pat. Off. . |
| 0246458 | 11/1985 | European Pat. Off. . |
| 2529013 | 6/1983 | France . |
| 8602490 | 4/1986 | World Int. Prop. O. . |

OTHER PUBLICATIONS

J. C. Edwards, "Photo-Defined Lamination for Chip Bonding", IBM Technical Disclosure Bulletin, vol. 25, No. 4, Sep. 1982, pp. 1952-1953.

R. J. Callimari et al., "X-Ray Lithography Enhancements/Extension", IBM Technical Disclosure Bulletin, vol. 24, No. 7A, Dec. 1981, pp. 3451-3452.

L. Kuhn et al., "High Density, Low-Temperature Solder Reflow Bonding of Silicon Chips to Plastic Substrates", vol. 18, No. 10, Mar. 1976, p. 3477.

*Primary Examiner*—Andrew J. James
*Assistant Examiner*—Teresa Davenport
*Attorney, Agent, or Firm*—Aziz M. Ahsan

[57] ABSTRACT

An integrated circuit chip packaging structure comprising a substrate, preferably a semiconductor base substrate, a conductive layer on said substrate in regions where connections to metallization layers of the substrate are formed, solder balls and gold bumps connected to said conductive layer in said regions of said conductive layer, and a solder stop layer on said conductive layer at least around said solder balls. The conductive layer, further comprises wiring lines. Further, a method of forming the structure is disclosed which uses only two masks for providing terminals for connecting the substrate to integrated circuits and to other substrates or to the printed circuit board and wiring lines. Thus, there is a need for one less metallization layer. The method is applicable to 200 mm wafers and allows two different packaging technologies (C-4 and TAB or wire-bonding) on the same substrate. Thus, packaging of VLSI circuits is improved.

18 Claims, 2 Drawing Sheets

INTEGRATED CIRCUIT SUBSTRATE WITH CONTACTS THEREON FOR A PACKAGING STRUCTURE

FIELD OF THE INVENTION

The present invention relates to the packaging of electronic components on a carrier, preferably on a silicon carrier, and particularly to an integrated circuit chip packaging structure which comprises on a substrate different terminals for different packaging or connection techniques.

BACKGROUND OF THE INVENTION

Modern integrated circuit chips comprise a plurality of input and output terminals (I/O) which have to be arranged on the limited plane of the chip or substrate size. This increasing plurality of I/O terminals must be connected to surrounding electronic components. Commonly the chips are directly connected to other chips or electronic components or are arranged on a chip carrier or a substrate which comprises wiring lines for interconnecting the chips.

The chip packaging structure of the present invention utilizes a multilayer substrate having several conductive planes separated by insulating layers. The substrates can be made of ceramic or silicon. Silicon carriers are preferred because of the similar manufacturing techniques in the chip production. Further, the thermal expansion coefficients are equal. A silicon substrate is disclosed in U.S. Pat. No. 4,866,507 (EP-A2-0 246 458) with further prior art references.

A well known technique for connecting the chip to a carrier is the controlled collapse chip connection (C-4) technique which allows a plurality of I/O's to be close together. This technique is disclosed in the U.S. Pat. No. 3,401,126 and U.S. Pat. No. 3,429,040. For the application of this technique the corresponding terminals of the carrier have to be precisely prepared with a contact layer which limits the size of the contact ball (ball limiting layer) and provides sufficient contact with the terminals of the carrier. Additionally, a solder stop layer can be necessary if the terminal is connected to wiring lines on the surface of the substrate. Commonly the substrate comprises on additional metallization plane which only serves for the connection of the chip by the C-4 technique.

Another well-known technique for packaging chips or carriers is the tape automated bonding (TAB) technique. TAB packaging involves the use of a web of material, generally called a carrier tape, to carry electrically conductive leads which provide connections between the chip and the outside world. An inner cluster of the conductive leads is bonded to the connecting pads of the chips or the substrate. The outer cluster is severed from the tape, and the outer leads of the tape/-chip or tape/carrier combination, respectively, are bonded to conductive pads residing on an underlying circuit board. This method as well as the wire-bonding technique allows no such plurality of I/O's as the C-4 technique. Both techniques imply a bump which is usually made of gold or of gold/copper and formed on the integrated circuits or on the carriers. There are several processes just for the purpose of forming these bumps on conductors, and they are well known to those skilled in the art. The bumps are relatively thick in comparison with usual layer dimensions. Further, the bumps need a contact layer for the connection with the metallization plane in the chip or carrier. The bumps are deposited by an electro-plating process, which requires an uninterrupted conductive layer over the carrier surface for uniform current distribution during electro-plating. It is called seed layer.

In order to allow the packaging of integrated circuit chips having a high density of I/O's and to reduce manufacturing costs, carriers, preferably silicon carriers, comprising terminals for C-4, connections and TAB or wire-bonding connections are necessary.

Thus, the invention as claimed solves the problem of providing an integrated circuit chip packaging structure and a method for manufacturing such a structure with high accuracy and a minimum of manufacturing steps.

SUMMARY OF THE INVENTION

A method of forming an integrated circuit chip packaging structure on a substrate comprising the following steps:

A. On a substrate comprising a pattern of terminal means, depositing a conductive layer on at least a portion of the substrate;

B. depositing a polymeric layer on at least a portion of the conductive layer;

C. forming a pattern of terminal vias that correspond to the pattern of terminal means;

D. removing the polymeric layer in the area of the terminal vias;

E. selectively depositing a photoresist layer over the patterned polymeric layer;

F. forming a pattern of at least one board connection terminal and at least one chip connection terminal, by providing a framing of the photoresist layer in the area of the board connection terminal and a cover of the photoresist layer in the area of the chip connection terminal;

G. forming a conductive bump on the conductive layer inside the framing;

H. removing the exposed regions of the polymeric layer and the conductive layer; and, I. finally removing the residue of the photoresist layer.

An integrated circuit packaging structure comprising:

a substrate with at least one terminal means, a conductive layer on the substrate covering at least a portion of the terminal means;

a conductive bump on at least a portion of the conductive layer;

a second layer on the conductive layer around at least a portion of the conductive bump.

BRIEF DESCRIPTION OF THE DRAWINGS

The features of the invention believed to be novel and the elements characteristic of the invention are set forth with particularity in the appended claims. The invention itself, however, both as to organization and method of operation, may best be understood by reference to the detailed description which follows taken in conjunction with the accompanying drawings in which:

DETAILED DESCRIPTION OF THE INVENTION

Figure 1:
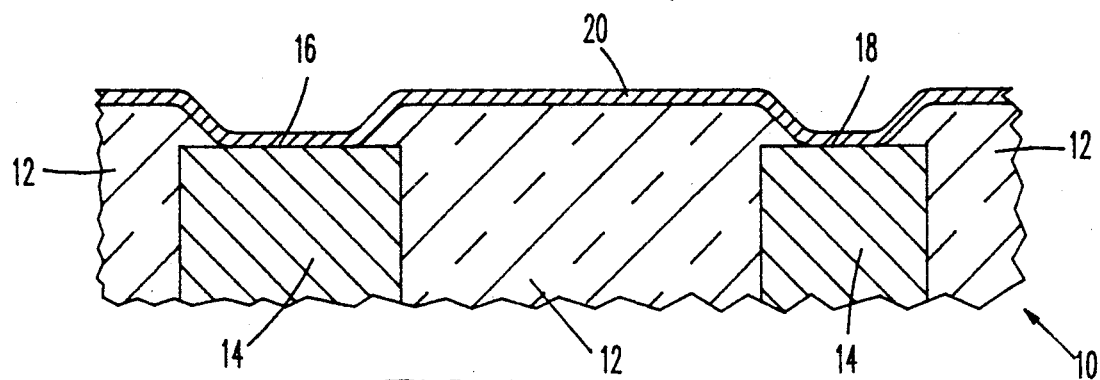
FIG. 1 is a cross-sectional view showing the conductive barrier-seed layer over the substrate.

Accordingly, the method of the invention is applied to a substrate which comprises at least wiring layers and insulating layers. Further, the surface of the substrate comprises a pattern of terminal vias arranged in an insulating layer and connected at least to one of the wiring layers. The substrate is well known in the art and may further comprise semiconductor layers in the case of a silicon carrier. Another kind of substrates serving as carrier are the well known ceramic substrates usually containing a plurality of wiring planes which interconnect the chips arranged on the carrier, and the chips with the outside world. Both substrates comprise on the surface terminals to be connected with one or more chips. These terminals are separated form each other by an insulating layer which additionally protects the layers below. Usually the terminals are manufactured by removing the insulating layer in the area of the terminals in order to expose conductive metal arranged below the insulating layer and to provide terminal vias. This way is advantageous for the present invention but other methods known in the art are possible to provide the terminals.

On the surface of the substrate a conductive barrier layer is deposited which adheres to the surface, prevents oxidation and diffusion, and improves the contact and conduct capability. This deposited layer serves both as a barrier layer against the metal pads and as a seed layer for electro-plating. This can be done by successively depositing chrome, copper and gold as known to a person skilled in the art. After the deposition of a polymeric layer on the already deposited conductive barrier layer, a pattern of terminal vias corresponding to the pattern on the surface of the substrate is lithographically formed in this polymeric layer. This step can be realized with the same mask as the forming of the terminal vias in the insulating layer of the substrate. Thus, if the terminals of the substrate are processed as described above, no additional mask for the next lithographical step is necessary. After this step the conductive barrier layer in the area of the terminals is exposed.

After depositing a photoresist layer over the patterned polymeric layer a pattern of board connection terminals and chip connection terminals is lithographically formed in the polymeric layer. The pattern in the polymeric layer corresponds to the pattern of terminals on the surface of the substrate. The board connection terminals serve for the connection of the substrate with the outside world, e.g. a printed circuit board, and comprise a framing of photoresist layer in the terminal area. The framing can have a circular, rectangular or any other appropriate shape.

The chip connection terminals which serve for connecting the substrate with a corresponding chip are defined by a cover of photoresist layer in the area of the terminals. After this step in the area of the board connection terminals the conductive barrier layer is exposed and surrounded by a photoresist layer framing, and in the area of the chip connection terminals the conductive barrier layer is covered by photoresist.

Subsequently, the chip connection terminals are completed by growing bumps, preferably gold bumps, on the exposed barrier layer inside the framing. A common method for providing gold bumps having a sufficient extension is electro-plating. The framing around the exposed barrier layer serves for forming and providing a mushroom like shape of the bumps.

In the next step the exposed photopolymeric layer and the barrier layer are removed by well known processes. With the removing of the barrier layer a part of the photoresist layer can be additionally removed, thus providing a photoresist layer with a reduced thickness.

With the final removing of the remaining photoresist layer the barrier layer in the area of the chip connection terminals is exposed. Further, a solder stop of polymeric layer can be provided, it can be arranged in the area of the terminals and forming frames around the exposed barrier layer. This prevents the flow of solder on wiring lines connected to the terminals by using the C-4 technique for packaging chips to the chip connection terminals. By applying other techniques in one of the following steps solder balls may be formed separately onto the barrier layer of the chip connection terminals.

Additionally, according to another feature of the invention an interconnect wiring is lithographically formed in the photopolymeric layer. This wiring is lithographically formed together with the terminals and handled corresponding to the chip connection terminals. Thus, after the final removal wiring lines remain with a polymeric layer as a protection layer on the barrier layer which serve as conductors.

The integrated circuit chip packaging structure according to the invention comprises a substrate as specified above and a conductive layer on the substrate connected to metallization layers of the substrate. The regions of the conductive layer serve as a barrier and as a ball limiting layer. The conductive layer is connected to solder balls and bumps and comprises a solder stop at least around the solder balls. According to a further feature of the invention the conductive layer provides wiring lines.

Surprisingly, the method according to the invention combines C-4 and TAB technology on a carrier or substrate. Advantageously, the process steps are simplified and minimized.

A further advantage is the application of lithographical steps. Thus, glass masks are used which additionally allow the employment of the invention on wafers having a diameter of 200 mm or more.

It is still another advantage of the invention that only two different masks for providing the structure are used. Additionally, the first mask can be previously used in the manufacture of the substrate.

Another advantage is the use of the barrier layer as a wiring layer which reduces the metal layers in the substrate without decreasing the density of the electrical behavior. Surprisingly, only one layer, the barrier layer, is able to serve as a ball limiting layer, contact layer, wiring layer and seed layer for electro-plating.

The invention is further applicable to chips, silicon carriers or ceramic carriers all serving as a substrate for the use of the invention.

For a better understanding of the present invention, together with further objects and advantages, a preferred embodiment of the invention is described in the following with reference to the accompanying drawings which depict the sequence of steps by a cross-section of a part of the structure.

FIG. 1 shows a part of a silicon carrier as a substrate 10 which comprises an insulating layer 12, e.g. polyimide, and a plurality of contact pads 14 of a metal layer. The surface of the contact pads 14 is formed as terminal vias 16, 18 in the insulating layer 12. The surface of the contact pads 14 and the insulating layer 12 forms the surface of the substrate 10 on which a conductive barrier layer 20 is deposited. For making the barrier-seed layer, respectively it is well known in the art to deposit chrome, copper and gold in this order by vaporization techniques. The deposition takes place over the complete substrate 10.

Figure 2:
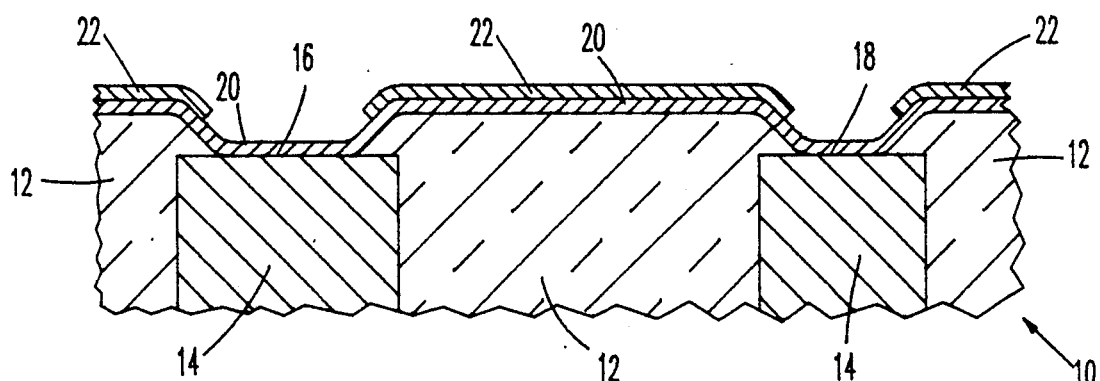
FIG. 2 is a cross-sectional view after a polymeric layer has been deposited and patterned.

In FIG. 2 a polymeric layer 22, e.g. polyimide is arranged over the conductive barrier-seed layer 20 and removed by a lithographical process in the areas of the terminal vias. The thickness of the polymeric layer 22 is in the range of 0.7 to 1 micron. For making the terminal vias, in the polymeric layer 22, the same mask which was used to form terminal vias 16 and 18 in the insulating layer 12 can be utilized.

Figure 3:
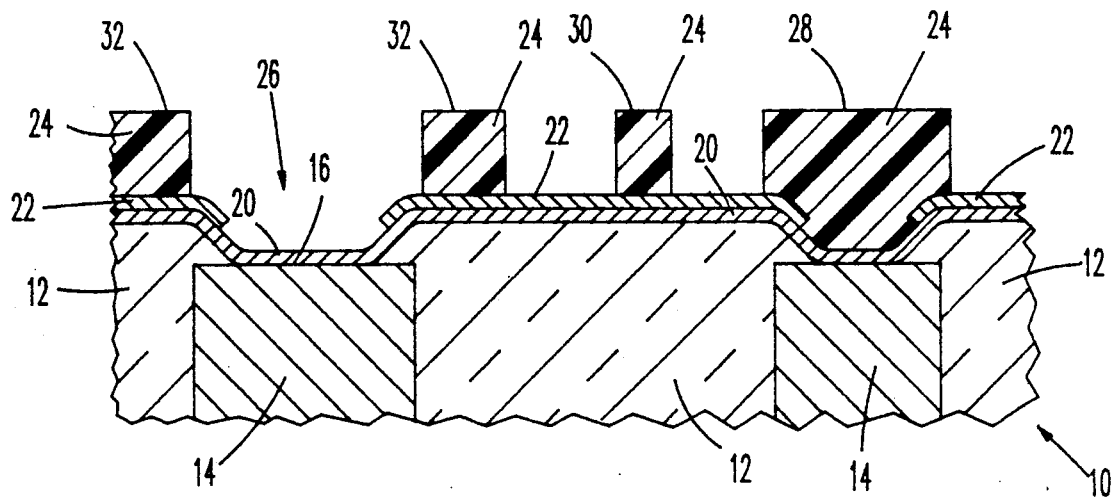
FIG. 3 is a cross-sectional view after the deposition and patterning of a photoresist layer.
Figure 4:
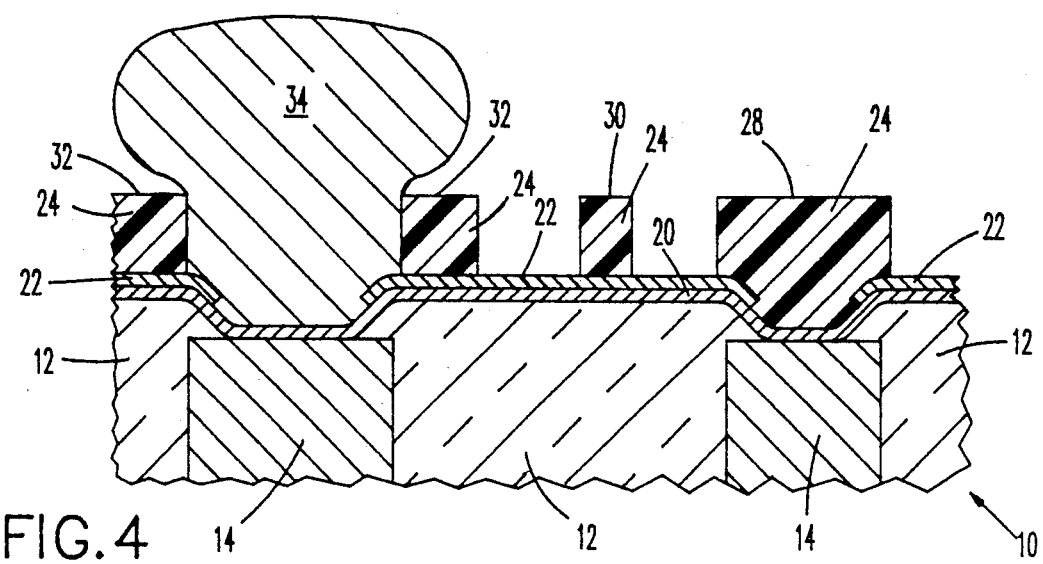
FIG. 4 shows the substrate after the bump has been formed.

After the exposure of the barrier layer 20 on the surface of the contact pads 14 of terminal vias 16, 18 a photoresist layer 24 having a thickness in the range of about 6 to 10 microns is deposited over the complete substrate 10. FIG. 3 shows the photoresist layer 24, after board connection terminals 26, chip connection terminals 28, and wiring lines 30 have been lithographically formed. The board connection terminals 26 comprise a framing 32 of photoresist layer 24 which surrounds an area of exposed barrier layer 20. The framing 32 is necessary to influence the growing of bumps 34 on the barrier layer 20 in the area of the board connection terminal 26 and gives the bump a mushroom-like form as depicted in FIG. 4. The chip connection terminals 28 as well as the wiring lines 30 comprise a cover of photoresist layer 24.

The bumps 34 of FIG. 4 are of gold and deposited by electro-plating.

Figure 5:
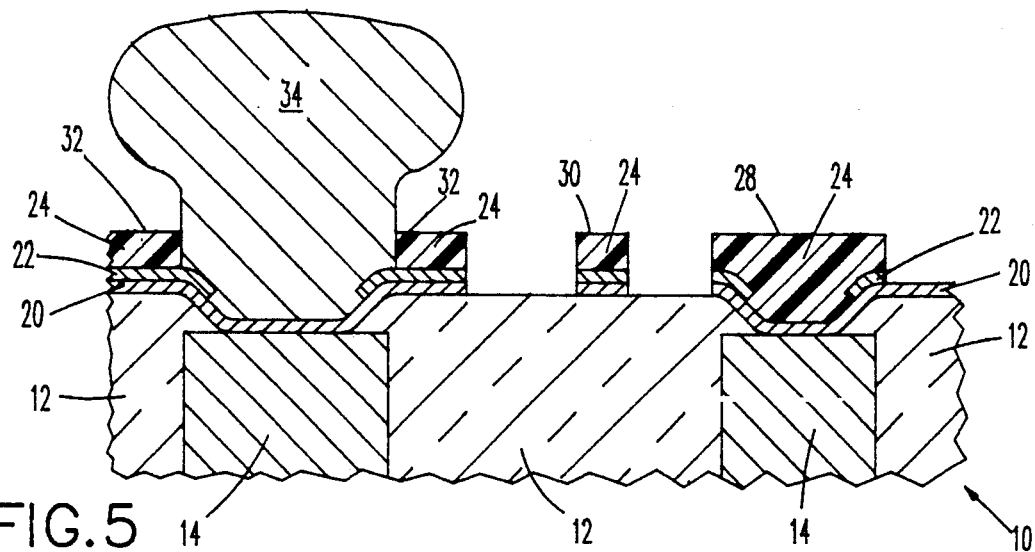
FIG. 5 shows the substrate after the barrier layer, polymeric layer and a portion of the photoresist layer has been removed.

In FIG. 5 the polymeric layer 22 and the barrier layer 20 are removed in the areas where these layers are not covered by the photoresist layer 24. With the removing of the polymeric layer 22 by a reactive ion etching process a part of the photoresist layer 24 is removed as well. As the photoresist layer 24 is much higher than the polymeric layer 22 the residue of the photoresist layer 24 serves for the subsequent wet etching process of the barrier-seed layer 20 which exposes the surface of the insulating layer 12.

Figure 6:
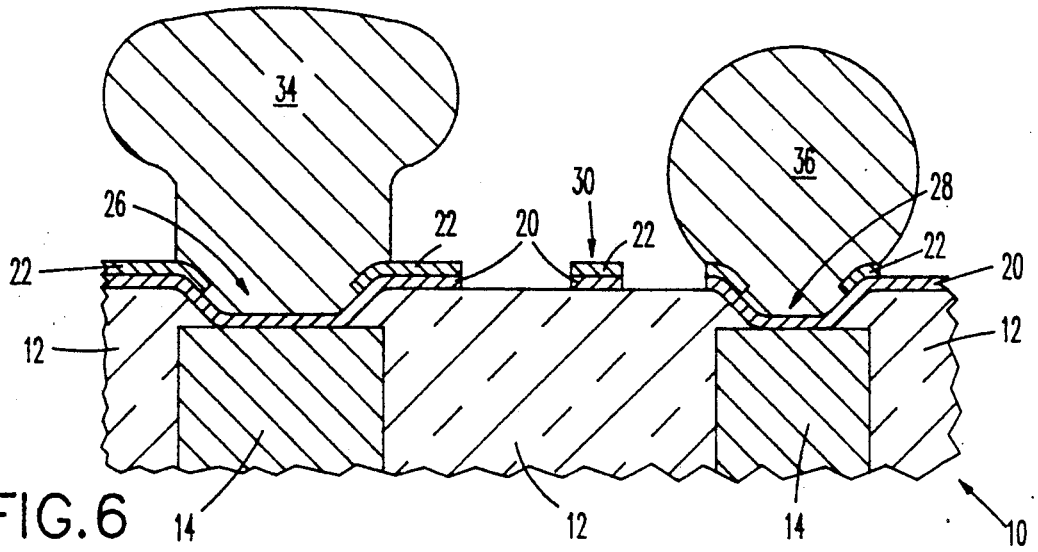
FIG. 6 shows the substrate of this invention having a bump, a wire line and a solder ball.

FIG. 6 depicts the board connection terminal 26, the chip connection terminal 28, and the wiring line 30 after the final removing of the photoresist layer 24 by processes well known in the art. The barrier layer 20 remains in the area of the terminals 26, 28 as a framing which serves at least in the area of the chip connection terminal 28 as a solder stop for the solder ball 36 which together with the chip is connected to the substrate by the C-4 technique. The barrier layer 22, remains on the wiring line 30 as a protection layer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An integrated circuit substrate with contacts thereon for a packaging structure comprising:
   a substrate with at least one terminal means,
   a conductive layer on said substrate covering at least a portion of said terminal means;
   a conductive bump on at least a portion of said conductive layer;
   an insulator layer on said conductive layer around at least a portion of said conductive bump, and wherein at least a portion of said insulator layer is underneath said conductive bump.

2. The structure of claim 1, wherein said conductive bump is a solder ball.

3. The structure of claim 1, wherein said conductive bump is a solder bump.

4. The structure of claim 1, wherein said conductive layer further forms a wiring line.

5. The structure of claim 1, wherein said conductive layer is a composition of chrome, copper and gold.

6. The structure of claim 2, wherein said conductive layer is a composition of chrome, copper and gold.

7. The structure of claim 1, wherein said insulator layer is a polymeric layer.

8. The structure of claim 1, wherein said insulator layer is a polyimide layer.

9. The structure of claim 1, wherein said conductive bump is a plated bump.

10. The structure of claim 1, wherein said conductive layer is a barrier-seed layer.

11. The structure of claim 10, wherein said barrier-seed layer comprises chrome, copper and gold.

12. The structure of claim 1, wherein the thickness of said polymeric layer is in the range of 0.7 to 1.0 micron.

13. The structure of claim 1, wherein at least one of said bump has a mushroom-like shape.

14. The structure of claim 1, wherein said bump is a gold bump.

15. The structure of claim 1, wherein said structure has at least two bumps.

16. The structure of claim 15, wherein at least one of said bump is a solder bump.

17. The structure of claim 15, wherein at least one of said bump is a gold bump.

18. The structure of claim 15, wherein at least one of said bump is a solder bump and at least one of said bump is a gold bump.

* * * * *